(12) United States Patent
Dragonu et al.

(10) Patent No.: US 10,401,453 B2
(45) Date of Patent: Sep. 3, 2019

(54) MAGNETIC RESONANCE IMAGING (71) Applicants: Siemens Healthcare Limited, Camberley (GB); Siemens Healthcare GmbH, Erlangen (DE); University College London, London (GB)

(72) Inventors: Iulius Dragonu, Harrow (GB); Craig Buckley, Norwich (GB); Heiko Meyer, Uttenreuth (DE); Nikolaus Weiskopf, Leipzig (DE); Martina Callaghan, London (GB); Daniel Papp, London (GB)

(73) Assignees: Siemens Healthcare Limited, Camberley (GB); Siemens Healthcare GmbH, Erlangen (DE); University College, London, London (GB)

( * ) Notice: Subject to any disclaimer, the term of this patent is extended or adjusted under 35 U.S.C. 154(b) by 148 days.

(21) Appl. No.: 15/712,942

(22) Filed: Sep. 22, 2017

(65) Prior Publication Data

US 2019/0094319 A1 Mar. 28, 2019

(51) Int. Cl.
| | |
|---|---|
| *G01R 33/48* | (2006.01) |
| *G01R 33/565* | (2006.01) |
| *G01R 33/385* | (2006.01) |
| *G01R 33/36* | (2006.01) |
| *G01R 33/567* | (2006.01) |

(52) U.S. Cl.
CPC ..... *G01R 33/4818* (2013.01); *G01R 33/3621* (2013.01); *G01R 33/385* (2013.01); *G01R 33/482* (2013.01); *G01R 33/4822* (2013.01); *G01R 33/5676* (2013.01); *G01R 33/56509* (2013.01)

(58) Field of Classification Search
CPC .............. G01R 33/4818; G01R 33/482; G01R 33/56509; G01R 33/4822; G01R 33/5676; G01R 33/3621; G01R 33/385
See application file for complete search history.

(56) References Cited

U.S. PATENT DOCUMENTS

| | | | |
|---|---|---|---|
| 6,894,494 B2* | 5/2005 | Stergiopoulos .. | G01R 33/56325 324/309 |
| 2003/0050552 A1* | 3/2003 | Vu ....................... | G01R 33/482 600/410 |
| 2009/0088626 A1* | 4/2009 | Sutton ................ | G01R 33/4806 600/419 |
| 2009/0267604 A1* | 10/2009 | Umeda .............. | G01R 33/4828 324/309 |

* cited by examiner

*Primary Examiner* — G. M. A Hyder
(74) *Attorney, Agent, or Firm* — Schiff Hardin LLP (57) ABSTRACT

A method of acquiring magnetic resonance imaging (MRI) data from an MRI scan of an object includes generating a number of excitation sequences by, in order: generating an excitation pulse, generating an imaging magnetic field gradient, and generating a spoiler magnetic field gradient. MRI data is acquired during the generation of the spoiler magnetic field gradients. The spoiler magnetic field gradients are selected such that, during each excitation sequence, substantially the same k-space trajectory is traversed during the generation of the spoiler magnetic field gradient.

37 Claims, 4 Drawing Sheets

MAGNETIC RESONANCE IMAGING

BACKGROUND OF THE INVENTION

Field of the Invention

The present disclosure relates to magnetic resonance image data acquisition and magnetic image resonance image data acquisition apparatus (e.g. MRI scanners).

Description of the Prior Art

The motion of patients or other subjects, within an MRI scanning apparatus is a significant source of artefacts in the resulting magnetic resonance image acquired from the subject. For example, up to 60% of clinical neurological examinations can typically be adversely affected by this problem. This can result in many image data acquisition scans having to be repeated to obtain good data to replace the motion-corrupted data previously acquired. The result of this is that more time, and money is spent on image data acquisition, and more discomfort is felt by patients, than would otherwise be the case.

Hence a method and apparatus for magnetic resonance image data acquisition, which is able to account for subject/patient motion, is highly desirable.

SUMMARY OF THE INVENTION

A first aspect of the invention is a method of acquiring magnetic resonance imaging (MRI) data in the frequency domain (k-space) from an MRI scan of an object, the method comprising: generating a plurality of excitation sequences, wherein generating each excitation sequence includes, in order, generating an imaging magnetic field gradient, and generating a spoiler magnetic field gradient; and, acquiring MRI data during the generation of the spoiler magnetic field gradients; wherein the spoiler magnetic field gradients are selected such that, during each excitation sequence, the same part of the frequency domain is re-sampled during the generation of the spoiler magnetic field gradient.

As a result of this method, the reading of MRI data occurs during the application of each spoiler gradient, and that data may be used for determining whether motion has occurred by the scanned object, during the scan. By applying spoiler gradients in a way that means the same k-space trajectory is traversed when the spoiler gradient is applied at the end of the excitation sequence (commonly referred to as the 'TR' in the art), one may monitor the obtained data for changes therein which indicate that object motion has occurred.

Advantageously, the generated spoiler magnetic field gradients result in the same k-space trajectory being traversed during the spoiler magnetic field gradients for each excitation sequence. Significantly, the present invention acquires MRI data during these spoiler magnetic field gradients. This acquired MRI data acts as navigator data to indicate whether there is object motion during the excitation sequences. In the absence of object motion, the acquired MRI data for each excitation sequence is expected to be the same because substantially the same k-space data is traversed for each excitation sequence. However, if object motion occurs in an excitation sequence, then the MRI data acquired during this excitation sequence will differ to the MRI data acquired during excitation sequences in which no motion occurred.

Therefore, the method of the first aspect is able to generate MRI data indicative of whether object motion occurs during an excitation sequence. Unlike in existing motion detection systems for MRI, the method of the first aspect does not require additional magnetic field gradients and thus a steady state is maintained. In addition, no additional hardware is required as the MRI data is acquired as an intrinsic part of the MRI scan. Further, no additional scan time is required, as the method utilises the spoiling gradient which is necessary for maintaining the steady state of the excitation sequences. As the method of the first aspect only requires the addition of an additional step of acquiring MRI data during the spoiler magnetic field gradients, it is easy to implement in existing excitation sequences.

In preferred embodiments, the term "imaging magnetic field gradient" is a term of art which refers to a gradient used to generate MRI signals of a region of interest in the object, used for generating an image.

In preferred embodiments, the term "spoiler magnetic field gradient" is a term of art which refers to a gradient used to reduce or eliminate steady-state transverse magnetization.

In preferred embodiments, the term "in order" indicates that the imaging magnetic field gradient, is followed by the spoiler magnetic field gradient. An excitation pulse is desirably followed by the imaging magnetic field gradient.

Desirably, the aforesaid same part of the frequency domain contains higher spatial frequencies than does any part of the frequency domain sampled during any part of an excitation sequence other than during the generation of the spoiler magnetic field gradient. This desirably results in the sampling, during the spoiler magnetic field gradient, or a region of k-space dominated by noise, rather than by image detail/data. It has been found that changes in this region of k-space are effective in identifying motion in a subject between MRI excitation sequences.

Desirably, the generating of the imaging magnetic field gradient comprises generating a frequency-encode magnetic field gradient along a first spatial axis, generating a phase encode magnetic field gradient along a second spatial axis, and generating a slice-select magnetic field gradient along a third spatial axis, wherein generating the spoiler magnetic field gradient comprises generating the spoiler magnetic field gradient along the first, second or third spatial axis.

The generating of each excitation sequence may include generating a frequency-encode magnetic field gradient along a first spatial axis, and the method desirably includes generating the spoiler magnetic field gradient along the first spatial axis. This choice of axis has been found to be most effective. While it is preferably to implement this using first spatial, it is to be understood that spoiler magnetic field gradient may be applied along other spatial axes described herein, as an alternative or in addition.

Desirably, the polarity of the spoiler magnetic field gradient is the same as the polarity of the frequency-encode magnetic field gradient immediately prior to generating the spoiler magnetic field gradient. The result is that the spoiler magnetic field gradient does not reverse the direction of movement/trajectory through k-space relative to the direction of movement/trajectory induced by the frequency-encode magnetic field gradient. The spoiler magnetic field gradient may therefore direct the k-space trajectory away from the k-space origin, towards peripheral regions of k-space.

Desirably, the generating of the imaging magnetic field gradient comprises generating a phase encode magnetic field gradient along a second spatial axis, and wherein generating each excitation sequence preferably further comprises generating a re-wind magnetic field gradient along the second spatial axis during the generation of the spoiler magnetic field gradient, wherein preferably the duration of the spoiler magnetic field gradient exceeds the duration of the re-wind magnetic field gradient along the second spatial axis. In this way, the spoiler magnetic field gradient may therefore direct the k-space trajectory away from the k-space origin, towards peripheral regions of k-space, during application of the re-wind magnetic field gradient and may then re-sample the same peripheral regions of k-space after the re-wind magnetic field gradient has ended. In this way, the k-space trajectory may be repeatedly returned to the same part of k-space at the end of each re-wind magnetic field gradient, so that the trajectory subsequently determined by the spoiler magnetic field gradient may then re-sample the same peripheral regions of k-space, for use in object motion detection.

The generating of each excitation sequence may further comprise generating a re-wind magnetic field gradient along the third spatial axis during the generation of (e.g. some of) the spoiler magnetic field gradient. Preferably, the duration of the spoiler magnetic field gradient exceeds the duration of the re-wind magnetic field gradient along the third spatial axis. Desirably, the polarity of the spoiler magnetic field gradient is opposite to the polarity of the re-wind magnetic field gradient. Preferably, the amplitude of the spoiler magnetic field gradient exceeds the amplitude of the re-wind magnetic field gradient. This aims to induce de-phasing as rapidly as possible.

The MRI data is preferably acquired after the generation of the re-wind magnetic field gradients. The term "re-wind magnetic field gradient" includes a reference to a gradient of equal amplitude and opposite polarity to the encoding gradients.

The frequency-encode magnetic field gradient may be arranged to generate a gradient echo. The gradient echo may be formed by applying a de-phasing gradient followed by a re-phasing gradient. The frequency-encode magnetic field gradient may be arranged to generate multiple gradient echoes.

The acquiring of the MRI data may comprise digitizing MRI signals received during the spoiler magnetic field gradients using an analogue-to-digital converter (ADC). The method may further comprise processing the MRI data so as to determine whether motion has occurred in the object represented by the MRI data. The processing may comprise extracting the magnitude (absolute value) of complex data acquired during application of the spoiler magnetic field gradient and using the processed data in identifying any of the plurality of excitation sequences in which object motion has occurred.

The acquiring of the MRI data may comprise acquiring a plurality of data sets corresponding to the plurality of excitation sequences, and the processing the MRI data may comprise identifying any of the plurality of excitation sequences in which object motion has occurred.

The processing the MRI data may comprise comparing the values of the MRI data to a predetermined threshold value, and for any of the MRI data values that exceed the predetermined threshold value, the method may further comprise identifying the excitation sequence associated with the MRI data value as being an excitation sequence in which object motion occurred.

If motion is determined to have occurred, then the excitation sequence in question may be identified as being one associated with object motion, and the data associated with that excitation sequence may be discarded. Subsequently, that excitation sequence may be repeated to obtain k-space data to replace the discarded data.

The acquiring of the MRI data may comprise acquiring a plurality of data sets each having a given number of MRI data values, and the processing the MRI data may comprise replacing the given number of MRI data values for each of the data sets with a single representative data value. For example, the given representative value may be the mean (average) value of the given number of MRI data values, or the value of the standard deviation or variance of them. The result is representative values equal in number to the number of data sets.

Preferably, for each of the plurality of data sets, the single representative value is the standard deviation across said given number of MRI data values. The method may further comprise normalising the single representative data values to obtain a corresponding normalised data values.

The method may further comprise: comparing the normalised data values to a predetermined threshold value, and for any of the normalised data values that exceed the predetermined threshold value, the method may further comprise identifying the excitation sequence associated with the normalised data value as being an excitation sequence in which object motion occurred.

In a second aspect, the invention provides a non-transitory computer readable media having computer instructions recorded thereon which, when executed by a processing device of a magnetic resonance imaging (MRI) system, are operable to control the MRI system to perform the method described above.

In a third aspect, the invention provides a magnetic resonance imaging system comprising a magnet assembly for establishing a magnetic field, at least one gradient coil, and a receiver coil, the MRI system being configured to: generate a plurality of excitation sequences by controlling, in order, the at least one gradient coil to generate an imaging magnetic field gradient and, the at least one gradient coil to generate a spoiler magnetic field gradient; and control the receiver coil to acquire MRI data during the generation of the spoiler magnetic field gradients; wherein the spoiler magnetic field gradients are selected such that, during each excitation sequence, the same part of the frequency domain is re-sampled during the generation of the spoiler magnetic field gradient.

In a fourth aspect, the invention provides a method for identifying spatial motion of an object during the acquisition of magnetic resonance imaging (MRI) data thereof by an MRI apparatus, comprising: providing first MRI data representing an object in motion during an MRI scan thereof by said MRI apparatus, the first MRI data comprising a number M of data sets each having a number P of MRI data values, wherein each of the M data sets is associated with an excitation sequence of the MRI scan; providing first motion data representing the spatial motion of the object in 3D space during the MRI scan, the first motion data comprising M data sets each having a number R of data values, and wherein each of the R data values represents a degree of freedom in the 3D space; and determining a linear transformation between the first motion data and the first MRI data such that when the linear transformation is applied to a said MRI data set, the P MRI data values are transformed into said R data values in the 3D space; and generating second MRI data representing a further object scanned by said MRI apparatus and comprising one or more MRI data sets having P MRI data values in the MRI data space; and applying the determined linear transform to the one or more MRI data sets of the second MRI data thereby to generate second motion data and therewith identifying spatial motion in said scanned further object.

A striking advantage of the above method that the linear transform may be established only once, e.g. when initially 'calibrating' the MRI apparatus (e.g. at the factory of manufacture), and can be used repeatedly thereafter.

That is to say, once one has determined the linear transform, one can then use that to 'predict' what motion has occurred in a subject without having to use a camera system directly measure motion in the subject—i.e. the application of the transform to the new MRI data for that subject will give values (e.g. one or more vectors, a matrix etc.) of predicted subject motion.

Without the linear transform one would have to obtain the vectors of subject motion using a camera system arranged to directly observe the subject while the MRI data was being acquired. With the linear model, there is no need to do that more than once for an initial calibration of a particular MRI apparatus.

Desirably, the MRI data is representable as a matrix, N, having M rows and P columns, desirably the motion data is representable as a matrix, C, having M rows and R columns, and desirably the linear transformation is representable as a matrix L, having P rows and R columns. Desirably, the determining the linear transformation comprises setting the matrix L to equal $(N^* \times N)^{-1} \times N^* \times C$, where $N^*$ is the transpose conjugate of N.

For example, the process may be as follows:

(1) Obtain an initial N matrix ($N_1$) by obtaining MRI data of a subject initially;

(2) Obtain a C matrix ($C_1$) at the same time as (1) using a camera system, as is done in prior art methods and known the person of ordinary skill in the art;

(3) Calculate L using $N_1$ and $C_1$ according to $L=(N_1^* \times N_1)^{-1} \times N_1^* \times C_1$;

(4) When one subsequently acquires new MRI data defined by a new N matrix ($N_2$) matrix, associated with a subsequent scan/object, one need not also acquire a corresponding new $C_2$ matrix from a camera system. Instead one may generate a 'model' $C_2$ matrix ($C_2^{model}$) where $C_2^{model} = [(N_1^* \times N_1)^{-1} \times N_1^* \times C_1] \times N_2$.

(5) Then calculate the magnitudes of spatial motion values/vectors comprised within $C_2^{model}$ and use those as appropriate (e.g. determine if a threshold is exceed) to identify if object motion has occurred during the new scan.

(6) Repeat steps (4) to (5) for each new data acquisition sequence/object.

The benefit of this is that one need only employ the system of cameras once at step (2), which may be implemented at the factory/production stage of the MRI apparatus, or during installation at a customer premises etc. The customer need not employ/purchase the camera system, and need not generate a new camera-based motion data matrix C each time a new scan takes place. The inventors have been very surprised to find that this method accurately generates motion data matrices C from which one may identify the presence of object/subject motion.

Furthermore, a key advantage of the linear model is that, to the surprise of the inventors, data from several subjects (scanned at different times by the same MRI apparatus) can be concatenated for a unique determination of the L matrix describing the linear transform.

The method may include concatenating both the motion data C matrix and the MRI data N matrix with several such subjects/objects. Thus, rather than increasing the number of excitation sequences applied to one subject, one can simply 'concatenate' the motion data C matrix and the N matrix results from several separate excitation sequences performed at a different times and on different subjects.

The term "concatenation" is a mathematical term in relation to matrices, as is well known in the art, and an example is illustrated as follows, where A is first motion data matrix and B is a subsequent motion data matrix, from which concatenation gives a motion data matrix C:

$$A = \begin{pmatrix} a_1 & a_2 \\ a_3 & a_4 \end{pmatrix},$$

$$B = \begin{pmatrix} b_1 & b_2 \\ b_3 & b_4 \end{pmatrix},$$

Then the concatenation (by rows) of A and B is:

$$C = \begin{pmatrix} a_1 & a_2 \\ a_3 & a_4 \\ b_1 & b_2 \\ b_3 & b_4 \end{pmatrix}.$$

It is to be understood that the term "concatenation" is intended to also refer to process termed "augmentation" which is equally applicable if one first transposes the initial motion data matrices. Augmenting the transposed two motion data matrices gives a transposed new motion data matrix:

$$\left(\begin{array}{cc|cc} a_1 & a_2 & b_1 & b_2 \\ a_3 & a_4 & b_3 & b_4 \end{array}\right).$$

Accordingly, the providing the MRI data and motion data may comprise providing MRI data and motion data acquired from a plurality of different objects during a plurality of MRI scans. This plurality of scan data may be used to build an expanded motion data matrix C via the augmentation process described above. This applies also to building a correspondingly expanded MRI data matrix (N) concatenated with the MRI data associated with the plurality of different objects during the plurality of MRI scans. This allows one to enhance, or 'train' the motion data matrix ($C_{concatenated}$) and the MRI data matrix ($N_{concatenated}$) used to generate the linear transform matrix:

$$L = ([N_{concatenated}]^* \times [N_{concatenated}])^{-1} \times [N_{concatenated}]^* \times [C_{concatenated}]$$

The providing the MRI data desirably comprises: generating M excitation sequences, wherein generating each excitation sequence includes, in order, generating an imaging magnetic field gradient, and generating a spoiler magnetic field gradient; and acquiring the MRI data during the generation of the spoiler magnetic field gradients; wherein the spoiler magnetic field gradients are selected such that, during each excitation sequence, the same part of the frequency domain is re-sampled during the generation of the spoiler magnetic field gradient.

In a fifth aspect, the invention provides a non-transitory computer readable media having computer instructions recorded thereon which, when executed by a processing device of a magnetic resonance imaging (MRI) system, are operable to control the MRI system to perform the method as described above.

In a sixth aspect, the invention provides a method of determining object motion during a magnetic resonance imaging (MRI) scan of the object, the method comprising: generating a number M of excitation sequences, wherein generating each excitation sequence comprises, in order, generating an imaging magnetic field gradient, and generating a spoiler magnetic field gradient; and acquiring MRI data during the generation of the spoiler magnetic field gradients, the acquired MRI data comprising M data sets each having a number P of MRI data values; processing the MRI data so as to determine whether object motion has occurred by transforming the MRI data into 3D space using the linear transformation determined according to the method described above, wherein the spoiler magnetic field gradients are selected such that, during each excitation sequence, a selected part of the frequency domain is re-sampled during the generation of the spoiler magnetic field gradient.

The method may further comprise processing the MRI data so as to determine whether motion has occurred in the object represented by the MRI data.

The acquiring the MRI data may comprise acquiring a plurality of data sets corresponding to said plurality of excitation sequences, and the processing the MRI data may comprise identifying any of the plurality of excitation sequences in which object motion has occurred.

The processing the MRI data may comprise comparing the values of the MRI data to a predetermined threshold value, and for any of the MRI data values that exceed the predetermined threshold value, the method may further comprises identifying the excitation sequence associated with the MRI data value as being an excitation sequence in which object motion occurred.

The processing the MRI data may comprise normalising the MRI data across the P data sets so as to provide M normalised MRI data sets each comprising P normalised data values.

The method may comprise applying the linear transformation to the M normalised MRI data sets so as to transform the M normalised MRI data sets into R transformed values in the 3D space.

The method further comprise: calculating a single representative value for the R transformed values; comparing the single representative value to a predetermined threshold value; and if the single representative value exceeds the predetermined threshold value, identifying the excitation sequence associated with the single representative value as being an excitation sequence in which object motion occurred.

The calculating the single representative value for the R transformed values may comprise calculating the square of each of the R transformed values, adding the squares together so as to calculate the sum of the squares, and calculating the square root of the sum of the squares.

In a seventh aspect, the invention provides a magnetic resonance imaging (MRI) system comprising a magnet assembly for establishing a magnetic field, at least one gradient coil, and a receiver coil, the MRI system being configured to: generate a plurality of excitation sequences by controlling, in order, the at least one gradient coil to generate an imaging magnetic field gradient and, the at least one gradient coil to generate a spoiler magnetic field gradient; and control the receiver coil to acquire MRI data during the generation of the spoiler magnetic field gradients; wherein the spoiler magnetic field gradients are selected such that, during each excitation sequence, the same part of the frequency domain is re-sampled during the generation of the spoiler magnetic field gradient; wherein the MRI system is configured to identify spatial motion of an object during the acquisition of magnetic resonance imaging (MRI) data thereof by the MRI system according to a process, comprising: providing first MRI data representing an object in motion during an MRI scan thereof by said MRI apparatus, the first MRI data comprising a number M of data sets each having a number P of MRI data values, wherein each of the M data sets is associated with an excitation sequence of the MRI scan; providing first motion data representing the spatial motion of the object in 3D space during the MRI scan, the first motion data comprising M data sets each having a number R of data values, and wherein each of the R data values represents a degree of freedom in the 3D space; and determining a linear transformation between the first motion data and the first MRI data such that when the linear transformation is applied to a said MRI data set, the P MRI data values are transformed into said R data values in the 3D space; and generating second MRI data representing an object scanned by said MRI apparatus and comprising one or more MRI data sets having P MRI data values in the MRI data space; applying the determined linear transform to the one or more MRI data sets of the second MRI data thereby to generate second motion data and therewith identifying spatial motion in said scanned object.

In an eighth aspect, the invention provides a non-transitory computer readable media having computer instructions recorded thereon which, when executed by a processing device of a magnetic resonance imaging (MRI) system, are operable to control the MRI system to perform the method as described above.

DESCRIPTION OF THE PREFERRED EMBODIMENTS

Figure 1:
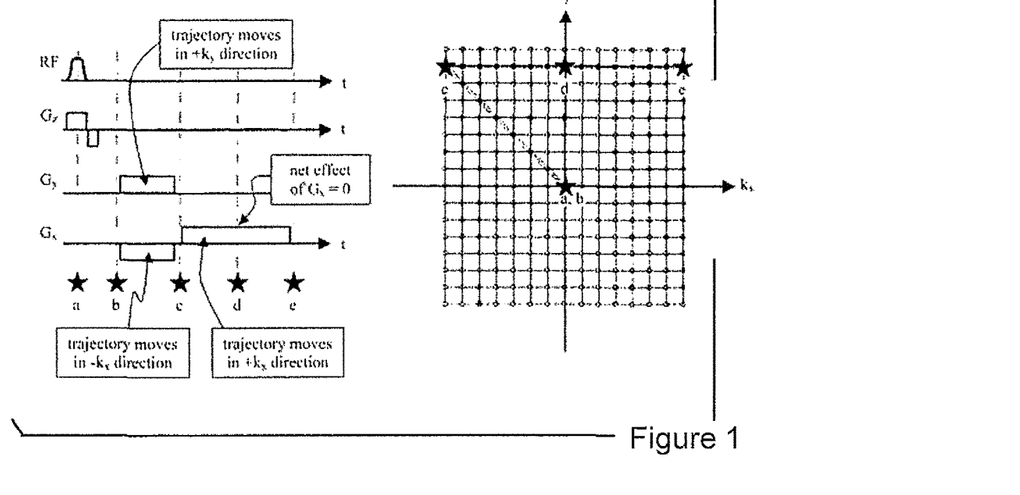
FIG. 1 shows a schematic representation of a plurality of excitation sequences generated by an MRI imaging system for defining a trajectory in the frequency-domain (k-space).

Referring to FIG. 1 there is schematically illustrated a plurality of excitation sequences (left-hand side of FIG. 1) generated by an MRI imaging system for defining a trajectory (right-hand side of FIG. 1) in the frequency-domain (k-space).

A first excitation sequence comprises a radio-frequency (RF) pulse which initiates magnetisation of an object which is the subject of the MRI scan. This occurs at an initial time point "a" indicated in FIG. 1. Concurrently with this initial time point, a slice-select magnetic field gradient ($G_z$) is applied in order to select a slice of the scanned object at a particular position along the spatial z-axis of the 3-D coordinate system of the MRI apparatus performing the scan. As is common practice in the field, this slice-select magnetic field gradient comprises an initial pulse period of positive polarity immediately followed by a brief pulse period of opposite polarity. Subsequently, no magnetic field gradient is applied along the z-axis which means that all subsequent scanning will occur within the slice/plane of the object which has been selected by the initial slice-select pulse.

Consequently, at a subsequent time point "b", and thereafter, only "phase-encoding" and "frequency-encoding" magnetic field gradients, $G_y$ and $G_x$ respectively, are applied to the scanned object. The phase-encoding magnetic field gradient is applied along the direction of the y-axis of the 3-D coordinate system of the MRI apparatus, whereas the frequency-encoding magnetic field gradient is applied along the direction of the x-axis of the 3-D coordinate system.

At the subsequent time point "b", a positive-polarity phase-encoding magnetic field gradient is applied along the y-axis, and simultaneously a negative-polarity frequency-encoding magnetic field gradient is applied along the x-axis. Both of these magnetic field gradient pulses persist for an equal period of time and simultaneously terminate at a point in time "c", as marked in FIG. 1.

As is well-known in the art, the application of a magnetic field gradient to a subject/object has the effect of moving the position in the frequency-domain (k-space) at which the resulting MRI image data is sampled. The duration of the application of a magnetic field gradient determines the extent or "distance" of movement of the sampling point in and through k-space, whereas the polarity of the applied magnetic field gradient determines the direction of travel (i.e. a reversal of polarity results in a reversal of the direction of travel through k-space). Application of a magnetic field gradient along a specified axis in 3-D space has the effect of moving the position of the frequency-domain image sampling point along the conjugate axis in k-space. For example, applying the phase-encoding magnetic field gradient ($G_y$) along the spatial y-axis has the effect of moving the k-space sampling point along the $k_y$-axis in the frequency domain. Similarly, applying the frequency-encoding magnetic field gradient ($G_x$) along the spatial x-axis has the effect of moving the k-space sampling point along the $k_x$-axis in the frequency domain.

Consequently, application of the positive-polarity phase-encoding magnetic field gradient ($G_y$) moves the frequency-domain sampling point positively along the positive $k_y$-axis, and simultaneous application of the negative-polarity frequency-encoding magnetic field gradient ($G_x$) moves the frequency-domain sampling point negatively along the positive $k_x$-axis. The result is a k-space trajectory of the sampling point diagonally to an upper left position in k-space at time point "c", as indicated in FIG. 1. This application of magnetic field gradients serves to select a particular point in k-space from which MRI image data will start to be sampled Subsequently, the application of a positive-polarity frequency-encoding magnetic field gradient along the x-axis from time point "c" to time point "e" moves the position of the sampling point in a trajectory along the positive $k_x$ direction, parallel to the $k_x$-axis, as indicated in FIG. 1. This serves to sample one entire "row" of k-space in a raster-type scanning of multiple successive neighbouring rows in k-space chosen to allow the scan to acquire sufficient k-space data to generate an MRI image of the scanned object, in the usual manner. Midway through the trajectory along this row of k-space, at point "d", the net magnetisation effect of the frequency-encoding magnetic field gradient momentarily becomes zero since the duration of the positive-polarity part of the frequency-encoding magnetic field gradient, at that time, is of equal duration and magnitude to the preceding negative-polarity part which took place between times "b" and "c".

Thus, according to prior systems, completion of the "row" of k-space from times "c" to "e", would be followed by a "re-wind" magnetic field gradient of negative polarity directed along the y-axis and a concurrent "spoiler" magnetic field gradient of negative polarity directed along the x-axis to return the k-space sampling point to the origin of k-space. Once there, a new excitation sequence commences which is qualitatively the same as sequence illustrated in FIG. 1, but in which the magnitude of the initial phase-encoding magnetic field gradient, directed along the y-axis, is different from the previous one (typically smaller) such that a different row of k-space (e.g. below, and parallel to the previously-sampled row) is selected for sampling. No MRI data is acquired/used during application of the rewind and spoiler magnetic field gradients in prior art systems.

Figure 2:
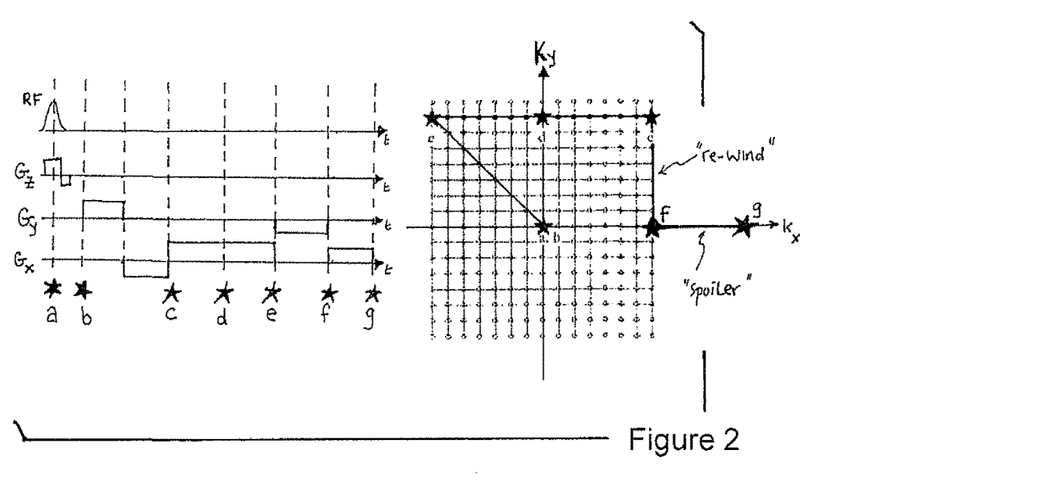
FIG. 2 shows a schematic representation of a plurality of excitation sequences generated by an MRI imaging system for defining a trajectory in the frequency-domain (k-space) according to an embodiment of the invention.

However, this is not so according to preferred embodiments of the present invention. Referring to FIG. 2, completion of the "row" of k-space from times "c" to "e", is followed by:

(1) First, a "re-wind" magnetic field gradient of negative polarity directed along the y-axis starting from time "e" and ending at time "f", and in the absence of any "spoiler" magnetic field gradient along the x-axis. This serves to return the k-space sampling point to a position on to the $k_x$ axis (i.e. $k_y$=0), but does not change the $k_x$ value in k-space, and wholly avoids the origin of k-space.

(2) Subsequently, after the "re-wind" magnetic field gradient has ended at time "f" a "spoiler" magnetic field gradient of positive polarity is generated and directed along the x-axis until time "g". This spoiler magnetic field gradient serves to move the k-space sampling point further away from the origin of k-space along a trajectory towards high $k_x$ values beyond the periphery of the region of k-space sampled for the purposes of MRI image formation.

Specifically, MRI data is acquired and stored during application of the period of time "f" to "g" while the spoiler magnetic field gradient is generated/applied. Hereafter, this acquired MRI data shall be referred to herein as 'MRI motion data'.

Once the spoiler magnetic field gradient has terminated, a new excitation sequence commences which is qualitatively the same as sequence illustrated in FIG. 2, but in which the magnitude of the initial phase-encoding magnetic field gradient, directed along the y-axis, is different from the previous one (typically smaller) such that a different row of k-space (e.g. below, and parallel to the previously-sampled row) is selected for sampling. The magnitudes and durations of the phase encoding magnetic field gradients, in a given phase-encoding sequence, at the beginning ("b") and end (re-winder: "e") of the sequence, have the same magnitude but opposite polarity. The trajectory of sampling in k-space is caused to resume the same point in k-space at time "f" such that subsequent application of the spoiler gradient causes the trajectory to retrace its path in k-space along the $k_x$ axis. MRI motion data is once more acquired stored during application of the spoiler magnetic field gradient. This process is repeated for each new excitation sequence.

The MRI motion data acquired and stored during different excitation sequences is then processed and compared in order to determine whether motion in the scanned object has occurred as between two different excitation sequences.

Figure 3A:
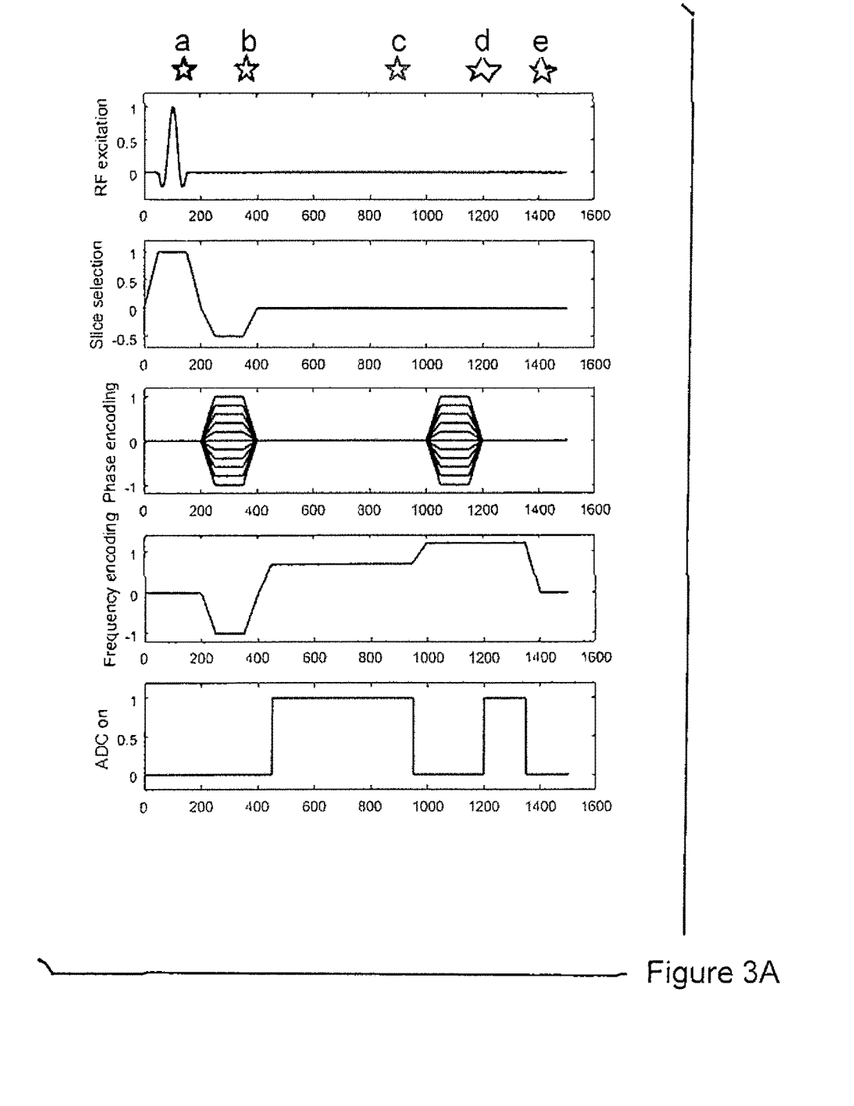
FIG. 3A shows a schematic representation of a plurality of excitation sequences generated by an MRI imaging system for defining a trajectory in the frequency-domain (k-space) according to an embodiment of the invention.
Figure 3B:
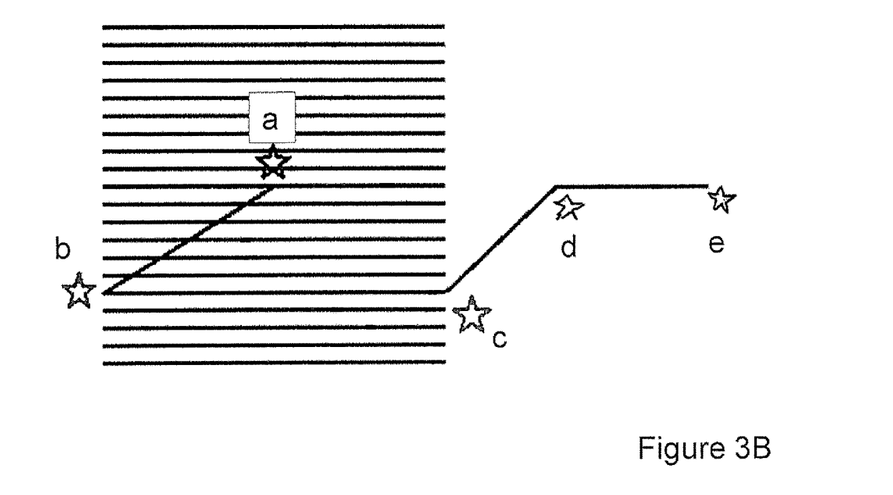
FIG. 3B shows a schematic representation of the trajectory in the frequency-domain (k-space) traversed as a result of the excitation sequences of FIG. 3A.

FIGS. 3A and 3B schematically illustrate another example of a plurality of excitation sequences (FIG. 3A) generated by an MRI imaging system for defining a trajectory (FIG. 3B) in the frequency-domain (k-space). The sequences are qualitatively as described above with reference to FIG. 2, and the k-space trajectory is quantitatively as described above with reference to FIG. 2. In particular, the excitation sequences comprise an RF excitation sequence which initiates at time "a" concurrently with a slice selection magnetic field gradient. Subsequently a phase-encoding magnetic field gradient of negative polarity is initiated at time "b" concurrently with, in this example, a frequency-encoding magnetic field gradient of negative polarity. This has the effect of causing a k-space trajectory along the diagonal line "a" to "b" (in the downward left direction as shown in FIG. 3B). After removal of the phase-encoding magnetic field gradient, the frequency-encoding magnetic field gradient is reversed and polarity and endures until time "c" thereby causing a k-space trajectory to progress along a line of increasing $k_x$ value and constant $k_y$ value (i.e. a "row" in a k-space raster scan). MRI image data is acquired during this period of time as indicated by the "ADC on" graph at the bottom of FIG. 3A.

This refers to the operation of the analogue-to-digital converter being in operation to convert acquired analogue data into digital data for use in image construction. Subsequently a re-wind phase-encoding magnetic field gradient of positive polarity is applied from time "c" to time "d" concurrently with a spoiler magnetic field gradient of positive polarity along the frequency-encoding axis. This has the effect of producing a diagonal trajectory from position "c" to position "d" as indicated in FIG. 3B. The spoiler magnetic field gradient persists alone thereafter until time "e" which extends the trajectory further away from all of the regions of k-space previously traversed by the trajectory. MRI motion data is acquired and stored during this period of time as indicated by the "ADC on" graph at the bottom of FIG. 3A.

This stored data will be used, as described below, in determining whether or not motion has occurred in the image object as between successive excitation sequences when scanning that object.

As shown in FIG. 3A, the excitation sequence for the phase encoding magnetic field gradient is illustrated with a phase-encoding table indicating the change in the magnitudes of the phase-encoding magnetic field gradients applied in successive excitation sequences in order to put effect to the raster-scan pattern of k-space schematically illustrated in FIG. 3B.

The MRI motion data acquired during a given spoiler magnetic field gradient may be represented by a matrix 'N' in which each matrix element comprises a complex-values MRI motion data element. The matrix N may have M rows and P columns. Spatial motion data (i.e. in the 3D space of the MRI apparatus) may be represented by a matrix 'C' given by:

$$C = \begin{pmatrix} \dot{x}_1, & \dot{y}_1, & \dot{z}_1, & \dot{\theta}_1, & \dot{\phi}_1, & \dot{\varphi}_1 \\ \dot{x}_2, & \dot{y}_2, & \dot{z}_2, & \dot{\theta}_2, & \dot{\phi}_2, & \dot{\varphi}_2 \\ & & \vdots & & & \\ \dot{x}_n, & \dot{y}_n, & \dot{z}_n, & \dot{\theta}_n, & \dot{\phi}_n, & \dot{\varphi}_n \end{pmatrix}$$

Here, the quantities $\dot{x}_i, \dot{y}_i, \dot{z}_i, \dot{\theta}_i, \dot{\phi}_i, \dot{\varphi}_i$ represent the rate of change of positions of the $i^{th}$ scan of an object in the x, y and z coordinates of the MRI system, and the rates of change of the angles of pitch, roll and yaw of the object. Matrix, C is a matrix having rows each of which is a vector defined by the six degrees of freedom as described above, representing motion of an object during a separate respective MRI scan.

In general, matrix sizes are defined as (number of lines/rows)×(number of columns).

In the matrix equation:

$C = N \times L$

C is a matrix containing information from the motion correction camera or any MRI based positioning calibration (navigator, low resolution imaging techniques) of size (number of repetitions of the sequence)×(6 degrees of freedom).

N is a matrix containing data acquired during the spoilers, and processed as described previously, of size (number of different positions during calibration)×(number of receive channels). The number of different positions referred to here corresponds with the number of repetitions of the sequence.

L is a matrix defining a linear model matrix describing the relation between motion data and the parameters determined by the data acquired during spoilers. He size of L is (number of receive channels)×(6 degrees of freedom).

Thus, matrix C (Number of different positions during calibration×6 degrees of freedom)=N (Number of different positions during calibration×Number of receive channels)×L (Number of receive channels×6 degrees of freedom).

If one concatenates the data from several subjects/volunteers, column wise, the C matrix will become larger having more positions during calibration, as well as the N matrix. However, matrix L remains unchanged. Calibration data may be obtained for each particular coil of a given MRI apparatus, depending on number of receive channels and geometry.

The linear transform matrix L may be obtained from the N and C matrices as follows:

$L = (N^* \times N)^{-1} \times N^* \times C$, where $N^*$ is the transpose conjugate of $N$.

$N^* \times N$ is a matrix of size=(Number of receive channels)×(Number of receive channels).

$N^*$ is a matrix of size=(Number of receive channels)×(Number of different positions during calibration).

$(N^* \times N)^{-1} \times N^*$ is a matrix of size=(Number of receive channels)×(Number of different positions during calibration)

$(N^* \times N)^{-1} \times N^* \times C$ is a matrix of size=(Number of receive channels)×(6 degrees of freedom). This is exactly the same size as L.

A number of positions of an imaged object/subject are sampled during calibrations, and most preferably this number is higher than the number of receive channels of the MRI apparatus being used.

Motion data can be obtained initially using a motion camera, as described above, alternatively initial motion data may be obtained via a rapid MRI acquisition such as a so-called 'Spoiled Gradient Recalled Echo (GRE)' as would be readily apparent to the skilled person.

The processing of the stored MRI data acquired during spoiler magnetic field gradients may be as follows:
(1) Obtain an initial N matrix ($N_1$) by obtaining MRI data of a subject initially;
(2) Obtain a C matrix ($C_1$) at the same time as (1) using a camera system, as is done in prior art methods and known the person of ordinary skill in the art;

(3) Calculate L using $N_1$ and $C_1$ according to $L=(N_1^* \times N_1)^{-1} \times N_1^* \times C_1$;

(4) When one subsequently acquires new MRI data defined by a new N matrix ($N_2$) matrix, associated with a subsequent scan/object, one need not also acquire a corresponding new $C_2$ matrix from a camera system. Instead one may generate a 'model' $C_2$ matrix ($C_2^{model}$) where: $C_2^{model}=[(N_1^* \times N_1)^{-1} \times N_1^* \times C_1] \times N_2$.

(5) Then calculate the magnitudes of spatial motion values/vectors comprised within $C_2^{model}$ and use those as appropriate (e.g. determine if a threshold is exceed) to identify if object motion has occurred during the new scan.

(6) Repeat steps (4) to (5) for each new data acquisition sequence/object.

As discussed above, the invention as illustrated in the present embodiments, is in the acquisition of motion data during the spoiler magnetic field gradients displayed in FIG. 2 and FIG. 3A. It is to be understood that this principle is not restricted it to a particular data processing of the motion data so acquired.

One example of an implementation of suitable data processing of the motion data is the following.

Step 1: Once the motion data (MRI data has acquired during a spoiler magnetic field gradient) is to hand, one may determine the magnitudes (absolute value) of the complex-valued data in question, and calculate the mean (average) value for each data acquisition channel (e.g. data may be acquired with a 32 channel coil). This averaging process results in a single representative data value per channel. Optionally, this may involve applying a smoothing step upon the magnitudes (absolute value) of the complex-valued data values for each of the channels, separately, with a sliding window of suitable size. For example, a sliding window extending over a consecutive such magnitude values may be used, whereby a smoothed value is determined at each position of the window using the 20 values within it at that position. The mean (average) value of all smoothed values then provides the representative data value for each channel.

Step 2: Each channel is normalized to give it a mean value of one (1).

Step 3: Each vector in a matrix (N) of elements is multiplied by the linear transform matrix (L). Each vector within N corresponding to data acquired from one of each excitation sequence. The dimensions of the matrix L can vary depending on the coil used for the data acquisition. The result of this multiplication is matrix ($C^{model}$). Fewer than 6 degrees of freedom may be used, such as 1, 2, 3, 4, or 5 degrees of freedom selected from amongst those of translations in: x, y, z, pitch, roll and yaw.

Step 4: The square root of the sum-of-squares of these six vector elements is calculated for each excitation sequence (commonly known as a 'TR', or 'repetition').

Step 5: This square root value compared to a predetermined threshold value. If the square root value is above the previously established threshold, it is deemed to identify motion in the subject and the MRI data associated with the excitation sequence in question is identified/flagged for re-acquisition. The excitation sequences thus flagged are re-acquired in a sequential fashion.

In experiments performed by the inventors, the matrix ($C^{model}$) for the linear transform model was established for several volunteers with a 32 channel coil. This had very similar values for different volunteers and so a calibration step was necessary only once with one volunteer, although improvement in the matrix was gained by concatenation (see above) with results from subsequent volunteers/subjects. This calibration may be performed for each coil available in the MRI apparatus.

In an alternative example, not involving the linear transformation model, an implementation of suitable data processing of the motion data is the following.

Step 1: Once the motion data (MRI data has acquired during a spoiler magnetic field gradient) is to hand, one may determine the magnitudes (absolute value) of the complex-valued data in question, and calculate the mean (average) value for each data acquisition channel (e.g. data may be acquired with a 32 channel coil). This averaging process results in a single representative data value per channel.

Step 2: Calculate the standard deviation of all of the single representative data value across all channels.

Step 3: Repeat steps 1 and 2 for each step of the gradient table (e.g. the phase-encoding table of FIG. 3A). Optionally, depending on the resolution of the resulting standard deviation values so collected, a smoothing operation with a sliding window of 20 repetitions is performed for each standard deviation value calculated in Step 2. The smoothed data is subsequently normalized to have a mean value of zero and a standard deviation of one.

Step 4: Each standard deviation value is compared to a predetermined threshold value. If the standard deviation value is above the previously established threshold, it is deemed to identify motion in the subject and the MRI data associated with the excitation sequence in question is identified/flagged for re-acquisition. The excitation sequences thus flagged are re-acquired in a sequential fashion.

Figure 4:
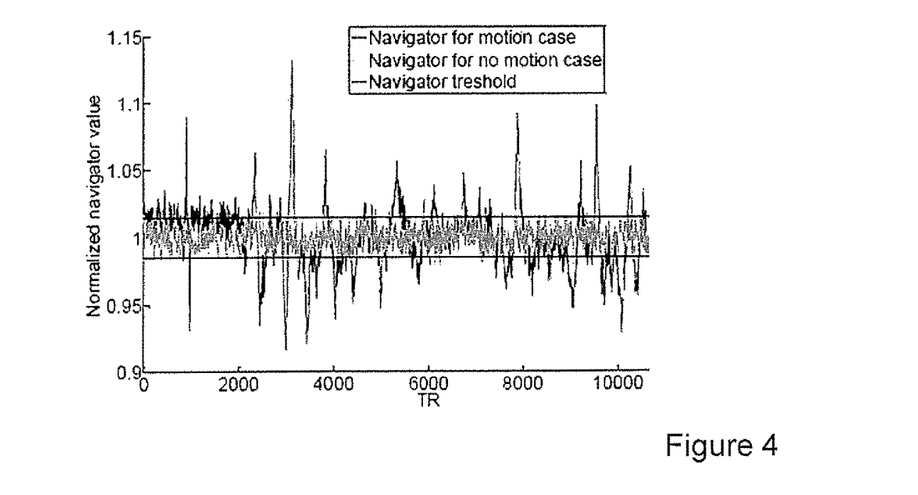
FIG. 4 shows a graph of data derived from a plurality of MRI excitation sequences according to an embodiment of the invention, from which motion of a scanned subject is identifiable.

FIG. 4 graphically shows a sequence of MRI motion data values determined according to embodiments of the invention, in which the data resulting from the motion data processing described in any of the examples given above, is compared to a predetermined threshold value. This corresponds to, e.g. 'Step 5' described above when using the linear transform model, or 'Step 4' when not using that model. The term 'navigator' is used in FIG. 4 to refer to the data resulting from the motion data processing which is compared to a predetermined threshold. The predetermined threshold may be determined empirically.

In the data marked 'Navigator for motion case', the navigator data corresponds to data acquired from a subject known to be moving during MRI motion data acquisition (spoiler field gradients applied), and this repeatedly exceeds the 'Navigator threshold' lines indicated in FIG. 4. However, in the data marked 'Navigator for no motion case', the navigator data corresponds to data acquired from a subject known to be not moving during MRI motion data acquisition (spoiler field gradients applied), and data consistently remains within the 'Navigator threshold' lines.

In another embodiment, an intrinsic method for detecting motion in MRI scans is provided, based on acquiring navigator data concurrently with gradient spoiling. This implementation requires no additional scan time, does not affect the steady-state, and can be extended to all sequences with similar spoiling characteristics. The implementation of this novel method may, for example, be implemented in a 3D FLASH sequence, an example of which is schematically shown in FIG. 5, which may be used as part of a multi-parameter mapping quantitative imaging protocol.

Sequence Implementation

Figure 5:
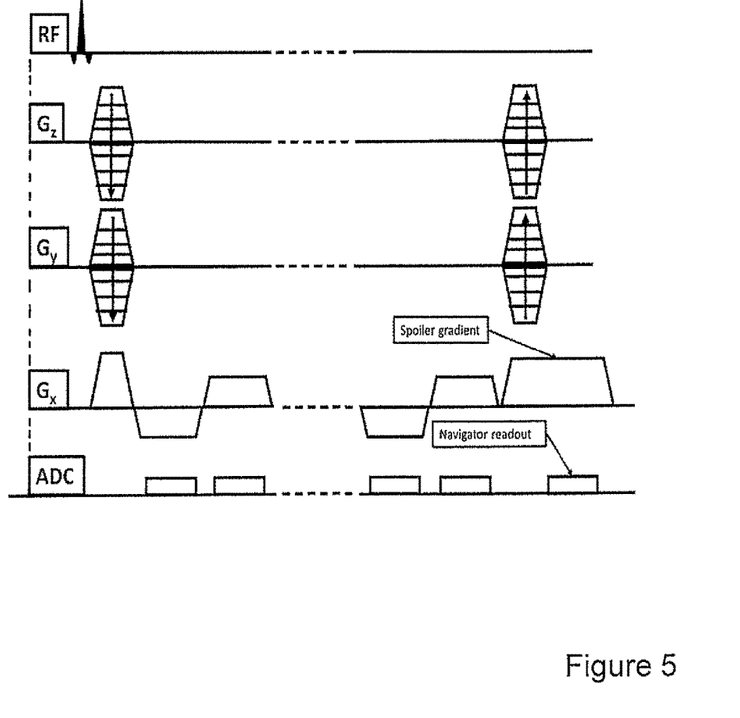
FIG. 5 shows a schematic representation of a plurality of excitation sequences generated by an MRI imaging system for defining a trajectory in the frequency-domain (k-space) according to an embodiment of the invention.

The navigator was implemented in a multi-echo 3D FLASH sequence (FIG. 5). In the sequence, at the end of each TR, the phase-encoding gradients are rewound, and a spoiling gradient is applied on the read-out axis. In order to achieve sufficient spoiling, the duration of the spoiler gradient exceeds that of the re-winding gradients, thus for each excitation, the same k-space trajectory is traversed. The navigator is acquired during this time and is expected to be constant over time in the absence of motion such that a change in the navigator value would be indicative of motion.

Study Design and Data Acquisition

Two volunteers were scanned on a 3T Magnetom Tim Trio (Siemens Healthcare, Erlangen, Germany) using a 3D FLASH sequence with: FoV=256×240×176 mm$^3$, TR=25 ms, 8 echoes, TE/echo spacing=2.34/2.3 ms, GRAPPA 2×2, 1 mm isotropic resolution, FA=6°, RF receive 32-channel head coil. A prospective motion-correction system was used to track, but not correct for, true head motion.

Volunteer 1 underwent two scanning sessions, while volunteer 2 underwent one. Navigator data was acquired with either "no motion", where the volunteers were asked to stay still, or with "motion", whereby the volunteers were asked to periodically perform large head motions in all directions.

Data Processing

The 32-channel navigator data was processed in MAT-LAB (The Mathworks, Natick, USA) by:

taking the mean magnitude across all ADC samples for each channel calculating the standard deviation of this mean across channels smoothing across TRs with a sliding window of 20 TRs Since weighted image data has arbitrary units, this result was normalised by the mean across all TRs to give the final, normalised navigator value. Volunteer motion, as measured by the camera system was used as a standard in classifying TRs as "motion corrupted" or "uncorrupted". Volunteer motion was characterized by the summary speed measure of "S" where:

$$S^2 = (dx/dt)^2 + (dy/dt)^2 + (dz/dt)^2 + (d\text{Pitch}/dt)^2 + (d\text{Roll}/dt)^2 + (d\text{Yaw}/dt)^2.$$

Using the distribution of "S" across all "no motion" scans, a threshold of "S">3 was chosen because this threshold incorrectly classified less than 5% of any "no motion" scan as being motion corrupted. To ensure the false positive rate of a classification based on the navigator measure would also not exceed 5% (in "no motion" cases), a threshold was defined as follows: The standard deviation (across TRs) of the normalized navigator value was calculated for each "no motion" case. This standard deviation was found to be similar for all "no motion" cases. The threshold was then defined as twice the mean (across "no motion" cases) standard deviation.

Motion increases the standard deviation of the navigator value. Thus, the general threshold defined above was used to classify TRs as "motion corrupted" or "uncorrupted". This classification was compared against the gold standard of the camera data and the sensitivity and specificity were calculated.

FIG. 4 shows results which are also qualitatively representative of results obtained in the present example, with two navigators acquired on the first volunteer, for "no motion", and "motion" conditions, along with the navigator threshold. Sensitivity and specificity for the method for four "motion" cases are shown in Table 1.

TABLE 1

| Motion case | Sensitivity (%) | Specificity (%) |
|---|---|---|
| Case 1 | 46 | 69 |
| Case 2 | 52 | 89 |
| Case 3 | 49 | 89 |
| Case 4 | 42 | 85 |

Sensitivity may be defined as the effectiveness in correctly identifying persons with a motion condition (true-positives divided by all persons with the motion condition). Specificity may be defined as the effectiveness in correctly identifying as negative persons who do not have a motion condition (true-negatives divided by all persons without the motion condition).

Motion cases 1 to 3 were acquired on volunteer 1, and motion cases 2 and 3 were acquired in the same scanning session. False positive rates are below 30% for all "motion" cases. The maximum sensitivity and specificity (in "motion cases") were 52% and 89% respectively. Depending on the choice of threshold, the sensitivity can be increased but at the cost of specificity, and increased false positive rates for "no motion" cases.

This novel intrinsic navigator approach can be used to identify subject motion (e.g. head motion) during scanning without incurring the typical penalties of increased scan time or perturbation of the steady state. It can be applied to any acquisition approaches with similar spoiling characteristics. After normalisation, the navigator measure can be used to classify TRs into "motion corrupted" and "uncorrupted", with good sensitivity, and low false positive rates based on a general threshold derived from separate "no motion" data.

At least some elements discussed herein may be constructed, partially or wholly, using dedicated special-purpose hardware. Terms such as 'component', 'module' or 'unit' used herein may include, but are not limited to, a hardware device, such as a Field Programmable Gate Array (FPGA) or Application Specific Integrated Circuit (ASIC), which performs certain tasks.

At least some elements may be may be configured to reside on an addressable storage medium and be configured to execute on one or more processors. That is, the elements may be implemented in the form of a tangible computer-readable storage medium having recorded thereon instructions that are, in use, executed by a computer or other suitable device. The elements may include, by way of example, components such as software components, object-oriented software components, class components and task components, processes, functions, attributes, procedures, subroutines, segments of program code, drivers, firmware, microcode, databases, data structures, tables, arrays, and variables. The tangible medium may take any suitable form, but examples include solid-state memory devices (ROM, RAM, EPROM, EEPROM, etc.), optical discs (e.g. Compact Discs, DVDs, and others), magnetic discs, magnetic tapes and magneto-optic storage devices.

The example embodiments have been described with reference to the example components, modules and units discussed herein. Where appropriate, these functional elements may be combined into fewer elements or separated into additional elements. In some cases the elements are distributed over a plurality of separate computing devices that are coupled by a suitable communications network, including any suitable wired networks or wireless networks.

Although a few preferred embodiments have been shown and described, it will be appreciated by those skilled in the art that various changes and modifications might be made without departing from the scope of the invention, as defined in the appended claims.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method of acquiring magnetic resonance imaging (MRI) data in the frequency domain (k-space) from an MRI scan of an object, the method comprising:
generating a plurality of excitation sequences, wherein generating each excitation sequence includes, in order, generating an imaging magnetic field gradient, and generating a spoiler magnetic field gradient; and
acquiring MRI data during the generation of the spoiler magnetic field gradients;
wherein the spoiler magnetic field gradients are selected such that, during each excitation sequence, the same part of the frequency domain is re-sampled during the generation of the spoiler magnetic field gradient.

2. The method according to claim 1, wherein said same part of the frequency domain contains higher spatial frequencies than does any part of the frequency domain sampled during any part of a said excitation sequence other than during the generation of the spoiler magnetic field gradient.

3. The method according to claim 1, wherein generating each excitation sequence includes generating a frequency-encode magnetic field gradient along a first spatial axis, and the method includes generating the spoiler magnetic field gradient along the first spatial axis.

4. The method according to claim 3 wherein the polarity of the spoiler magnetic field gradient is the same as the polarity of the frequency-encode magnetic field gradient immediately prior to generating the spoiler magnetic field gradient.

5. The method according to claim 3, wherein generating the imaging magnetic field gradient comprises generating a phase encode magnetic field gradient along a second spatial axis, and wherein generating each excitation sequence further comprises generating a re-wind magnetic field gradient along the second spatial axis during the generation of the spoiler magnetic field gradient, wherein the duration of the spoiler magnetic field gradient exceeds the duration of the re-wind magnetic field gradient along the second spatial axis.

6. The method according to claim 5, wherein generating each excitation sequence further comprises generating a re-wind magnetic field gradient along the third spatial axis during the generation of the spoiler magnetic field gradient, wherein the duration of the spoiler magnetic field gradient exceeds the duration of the re-wind magnetic field gradient along the third spatial axis.

7. The method according to claim 6, wherein the MRI data is acquired after the generation of the re-wind magnetic field gradients.

8. The method according to claim 5, wherein the MRI data is acquired after the generation of the re-wind magnetic field gradients.

9. The method according to claim 3, wherein the frequency-encode magnetic field gradient is arranged to generate a gradient echo.

10. The method according to claim 9, wherein the frequency-encode magnetic field gradient is arranged to generate multiple gradient echoes.

11. The method according to claim 1 wherein generating the imaging magnetic field gradient comprises generating a frequency-encode magnetic field gradient along a first spatial axis, generating a phase encode magnetic field gradient along a second spatial axis, and generating a slice-select magnetic field gradient along a third spatial axis, wherein generating the spoiler magnetic field gradient comprises generating the spoiler magnetic field gradient along the first spatial axis.

12. The method according to claim 1, wherein acquiring the MRI data comprises digitizing MRI signals received during the spoiler magnetic field gradients using an analogue-to-digital converter (ADC).

13. The method according to claim 1, further comprising processing the MRI data so as to determine whether motion has occurred in the object represented by the MRI data.

14. The method according to claim 13, wherein the acquiring the MRI data comprises acquiring a plurality of data sets corresponding to said plurality of excitation sequences, and the processing the MRI data comprises identifying any of the plurality of excitation sequences in which object motion has occurred.

15. The method according to claim 14, wherein the processing the MRI data comprises comparing the values of the MRI data to a predetermined threshold value, and for any of the MRI data values that exceed the predetermined threshold value, the method further comprises identifying the excitation sequence associated with the MRI data value as being an excitation sequence in which object motion occurred.

16. The method according to claim 14, wherein the acquiring the MRI data comprises acquiring a plurality of data sets each having a given number of MRI data values, and the processing the MRI data comprises replacing the given number of MRI data values for each of the data sets with a single representative data value.

17. The method according to claim 16, wherein for each of the plurality of data sets, the single representative value is the standard deviation across said given number of MRI data values.

18. The method according to claim 16, further comprising normalizing the single representative data values to obtain a corresponding normalized data values.

19. The method according to claim 16, further comprising: comparing the normalized data values to a predetermined threshold value, and for any of the normalized data values that exceed the predetermined threshold value, the method further comprises identifying the excitation sequence associated with the normalized data value as being an excitation sequence in which object motion occurred.

20. A non-transitory, computer readable data storage medium encoded with programming instructions, said storage medium being loaded into a computer of a magnetic resonance imaging (MRI) apparatus, and said programming instructions causing said computer to:
generate a plurality of excitation sequences, wherein generating each excitation sequence includes, in order, generating an imaging magnetic field gradient, and generating a spoiler magnetic field gradient;
acquire MRI data during the generation of the spoiler magnetic field gradients; and
wherein the spoiler magnetic field gradients are selected such that, during each excitation sequence, the same part of the frequency domain is re-sampled during the generation of the spoiler magnetic field gradient.

21. A magnetic resonance imaging system comprising a magnet assembly for establishing a magnetic field, at least one gradient coil, and a receiver coil, the MRI system being configured to:
generate a plurality of excitation sequences by controlling, in order, the at least one gradient coil to generate an imaging magnetic field gradient and, the at least one gradient coil to generate a spoiler magnetic field gradient;
control the receiver coil to acquire MRI data during the generation of the spoiler magnetic field gradients; and
wherein the spoiler magnetic field gradients are selected such that, during each excitation sequence, the same part of the frequency domain is re-sampled during the generation of the spoiler magnetic field gradient.

22. A method for identifying spatial motion of an object during the acquisition of magnetic resonance imaging (MRI) data thereof by an MRI apparatus, comprising:
providing first MRI data representing an object in motion during an MRI scan thereof by said MRI apparatus, the first MRI data comprising a number M of data sets each having a number P of MRI data values, wherein each of the M data sets is associated with an excitation sequence of the MRI scan;
providing first motion data representing the spatial motion of the object in 3D space during the MRI scan, the first motion data comprising M data sets each having a number R of data values, and wherein each of the R data values represents a degree of freedom in the 3D space;
determining a linear transformation between the first motion data and the first MRI data such that when the linear transformation is applied to a said MRI data set, the P MRI data values are transformed into said R data values in the 3D space;
generating second MRI data representing a further object scanned by said MRI apparatus and comprising one or more MRI data sets having P MRI data values in the MRI data space; and
applying the determined linear transform to the one or more MRI data sets of the second MRI data thereby to generate second motion data and therewith identifying spatial motion in said scanned further object.

23. The method according to claim 22, wherein said MRI data is representable as a matrix, N, having M rows and P columns, said motion data is representable as a matrix, C, having M rows and R columns, and the linear transformation is representable as a matrix L, having P rows and R columns, and wherein determining the linear transformation comprises setting the matrix L to equal $(N^* \times N)^{-1} \times N^* \times C$, where $N^*$ is the transpose conjugate of N.

24. The method according to claim 22, wherein providing the MRI data and motion data comprises providing MRI data and motion data acquired from a plurality of different objects during a plurality of MRI scans.

25. The method according to claim 22, wherein providing the MRI data comprises:
generating M excitation sequences, wherein generating each excitation sequence includes, in order, generating an imaging magnetic field gradient, and generating a spoiler magnetic field gradient;
acquiring the MRI data during the generation of the spoiler magnetic field gradients; and
wherein the spoiler magnetic field gradients are selected such that, during each excitation sequence, the same part of the frequency domain is re-sampled during the generation of the spoiler magnetic field gradient.

26. A non-transitory, computer readable data storage medium encoded with programming instructions, said storage medium being loaded into a computer of a magnetic resonance imaging (MRI) apparatus, and said programming instructions causing said computer to:
provide first MRI data representing an object in motion during an MRI scan thereof by said MRI apparatus, the first MRI data comprising a number M of data sets each having a number P of MRI data values, wherein each of the M data sets is associated with an excitation sequence of the MRI scan;
provide first motion data representing the spatial motion of the object in 3D space during the MRI scan, the first motion data comprising M data sets each having a number R of data values, and wherein each of the R data values represents a degree of freedom in the 3D space;
determine a linear transformation between the first motion data and the first MRI data such that when the linear transformation is applied to a said MRI data set, the P MRI data values are transformed into said R data values in the 3D space;
generate second MRI data representing a further object scanned by said MRI apparatus and comprising one or more MRI data sets having P MRI data values in the MRI data space; and
apply the determined linear transform to the one or more MRI data sets of the second MRI data thereby to generate second motion data and therewith identifying spatial motion in said scanned further object.

27. A method of determining object motion during a magnetic resonance imaging (MRI) scan of the object, the method comprising:
generating a number M of excitation sequences, wherein generating each excitation sequence comprises, in order, generating an imaging magnetic field gradient, and generating a spoiler magnetic field gradient;
acquiring MRI data during the generation of the spoiler magnetic field gradients, the acquired MRI data comprising M data sets each having a number P of MRI data values;
processing the MRI data so as to determine whether object motion has occurred by transforming the MRI data into 3D space using a linear transformation; and
wherein the spoiler magnetic field gradients are selected such that, during each excitation sequence, a selected part of the frequency domain is re-sampled during the generation of the spoiler magnetic field gradient.

28. The method according to claim 27, further comprising processing the MRI data so as to determine whether motion has occurred in the object represented by the MRI data.

29. The method according to claim 28, wherein the acquiring the MRI data comprises acquiring a plurality of data sets corresponding to said plurality of excitation sequences, and the processing the MRI data comprises identifying any of the plurality of excitation sequences in which object motion has occurred.

30. The method according to claim 29, wherein the processing the MRI data comprises comparing the values of the MRI data to a predetermined threshold value, and for any of the MRI data values that exceed the predetermined threshold value, the method further comprises identifying the excitation sequence associated with the MRI data value as being an excitation sequence in which object motion occurred.

31. The method according to claim 27, wherein processing the MRI data comprises: normalizing the MRI data across the P data sets so as to provide M normalized MRI data sets each comprising P normalized data values.

32. The method according to claim 31, further comprising applying the linear transformation to the M normalized MRI data sets so as to transform the M normalized MRI data sets into R transformed values in the 3D space.

33. The method according to claim 32, further comprising:
calculating a single representative value for the R transformed values;
comparing the single representative value to a predetermined threshold value; and
if the single representative value exceeds the predetermined threshold value, identifying the excitation sequence associated with the single representative value as being an excitation sequence in which object motion occurred.

34. The method according to claim 33, wherein calculating the single representative value for the R transformed values comprises calculating the square of each of the R transformed values, adding the squares together so as to calculate the sum of the squares, and calculating the square root of the sum of the squares.

35. The method according to claim 27, wherein said linear transformation is determined by providing first MRI data representing an object in motion during an MRI scan thereof by said MRI apparatus, the first MRI data comprising a number M of data sets each having a number P of MRI data values, wherein each of the M data sets is associated with an excitation sequence of the MRI scan, providing first motion data representing the spatial motion of the object in 3D space during the MRI scan, the first motion data comprising M data sets each having a number R of data values, and wherein each of the R data values represents a degree of freedom in the 3D space, determining a linear transformation between the first motion data and the first MRI data such that when the linear transformation is applied to a said MRI data set, the P MRI data values are transformed into said R data values in the 3D space.

36. A magnetic resonance imaging (MRI) system comprising a magnet assembly for establishing a magnetic field, at least one gradient coil, and a receiver coil, the MRI system being configured to:
generate a plurality of excitation sequences by controlling, in order, the at least one gradient coil to generate an imaging magnetic field gradient and, the at least one gradient coil to generate a spoiler magnetic field gradient;
control the receiver coil to acquire MRI data during the generation of the spoiler magnetic field gradients;
wherein the spoiler magnetic field gradients are selected such that, during each excitation sequence, the same part of the frequency domain is re-sampled during the generation of the spoiler magnetic field gradient;
wherein the MRI system is configured to identify spatial motion of an object during the acquisition of magnetic resonance imaging (MRI) data thereof by the MRI system according to a process, comprising:
providing first MRI data representing an object in motion during an MRI scan thereof by said MRI apparatus, the first MRI data comprising a number M of data sets each having a number P of MRI data values, wherein each of the M data sets is associated with an excitation sequence of the MRI scan;
providing first motion data representing the spatial motion of the object in 3D space during the MRI scan, the first motion data comprising M data sets each having a number R of data values, and wherein each of the R data values represents a degree of freedom in the 3D space;
determining a linear transformation between the first motion data and the first MRI data such that when the linear transformation is applied to a said MRI data set, the P MRI data values are transformed into said R data values in the 3D space;
generating second MRI data representing an object scanned by said MRI apparatus and comprising one or more MRI data sets having P MRI data values in the MRI data space; and
applying the determined linear transform to the one or more MRI data sets of the second MRI data thereby to generate second motion data and therewith.

37. A non-transitory, computer readable data storage medium encoded with programming instructions, said storage medium being loaded into a computer of a magnetic resonance imaging (MRI) apparatus, and said programming instructions causing said computer to:
generate a number M of excitation sequences, wherein generating each excitation sequence comprises, in order, generating an imaging magnetic field gradient, and generating a spoiler magnetic field gradient;
acquire MRI data during the generation of the spoiler magnetic field gradients, the acquired MRI data comprising M data sets each having a number P of MRI data values;
process the MRI data so as to determine whether object motion has occurred by transforming the MRI data into 3D space using a linear transformation determined by providing first MRI data representing an object in motion during an MRI scan thereof by said MRI apparatus, the first MRI data comprising a number M of data sets each having a number P of MRI data values, wherein each of the M data sets is associated with an excitation sequence of the MRI scan, providing first motion data representing the spatial motion of the object in 3D space during the MRI scan, the first motion data comprising M data sets each having a number R of data values, and wherein each of the R data values represents a degree of freedom in the 3D space, determining a linear transformation between the first motion data and the first MRI data such that when the linear transformation is applied to a said MRI data set, the P MRI data values are transformed into said R data values in the 3D space; and wherein the spoiler magnetic field gradients are selected such that, during each excitation sequence, a selected part of the frequency domain is re-sampled during the generation of the spoiler magnetic field gradient.

* * * * *